US009527721B2

(12) United States Patent
Cheng et al.

(10) Patent No.: US 9,527,721 B2
(45) Date of Patent: Dec. 27, 2016

(54) MOVEMENT MICROELECTROMECHANICAL SYSTEMS (MEMS) PACKAGE

(71) Applicant: Taiwan Semiconductor Manufacturing Co., Ltd., Hsin-Chu (TW)

(72) Inventors: Shyh-Wei Cheng, Hsinchu County (TW); Chao-Po Lu, Hsinchu County (TW); Chung-Hsien Hun, Hsinchu County (TW); Chih-Shan Chen, New Taipei (TW); Chuan-Yi Ko, Hsinchu County (TW); Chih-Yu Wang, Taichung (TW); Hsi-Cheng Hsu, Taichung (TW); Ji-Hong Chiang, Changhua County (TW); Jui-Chun Weng, Taipei (TW); Wei-Ding Wu, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/713,243

(22) Filed: May 15, 2015

(65) Prior Publication Data
US 2016/0332863 A1  Nov. 17, 2016

(51) Int. Cl.
*H04R 23/00* (2006.01)
*B81B 3/00* (2006.01)
*B81C 1/00* (2006.01)

(52) U.S. Cl.
CPC ......... *B81B 3/0005* (2013.01); *B81C 1/00984* (2013.01); *B81B 2201/0235* (2013.01);
(Continued)

(58) Field of Classification Search
CPC ................ B81B 3/0005; B81B 2201/0235; B81B 2207/012; B81C 1/00984; B81C 2203/0109; B81C 2203/036; B81C 2203/0785
(Continued)

(56) References Cited

U.S. PATENT DOCUMENTS 7,923,353 B2 * 4/2011 Makinen ............. H01L 21/3226
257/E21.122
2012/0244677 A1 * 9/2012 Lin ..................... B81C 1/00269
438/455
(Continued)

OTHER PUBLICATIONS

Maboudian, et al. "Self-assembled monolayers as anti-stiction coatings for MEMS: characteristics and recent developments." Sensors and Actuators 82 (2000) 219-223.

*Primary Examiner* — Tod T Van Roy
*Assistant Examiner* — Vu A Vu
(74) *Attorney, Agent, or Firm* — Eschweiler & Associates, LLC (57) ABSTRACT

The present disclosure relates to a microelectromechanical systems (MEMS) package with an anti-stiction layer, and an associated method of formation. In some embodiments, the MEMS package comprises a device substrate and a CMOS substrate. The device substrate comprises a MEMS device having a moveable or flexible part that is movable or flexible with respect to the device substrate. A surface of the moveable or flexible part is coated by a conformal anti-stiction layer made of polycrystalline silicon. A method for manufacturing the MEMS package is also provided.

20 Claims, 5 Drawing Sheets

(52) U.S. Cl.
CPC . *B81B 2207/012* (2013.01); *B81C 2203/0109* (2013.01); *B81C 2203/036* (2013.01); *B81C 2203/0785* (2013.01); *H01L 2924/1461* (2013.01)

(58) Field of Classification Search
USPC .......................................................... 257/418
See application file for complete search history.

(56) References Cited

U.S. PATENT DOCUMENTS

| | | | |
|---|---|---|---|
| 2012/0280591 A1 | 11/2012 | Schultz | |
| 2013/0099355 A1* | 4/2013 | Liu | H01G 5/16 |
| | | | 257/532 |
| 2013/0283913 A1* | 10/2013 | Lin | G01P 15/125 |
| | | | 73/514.32 |
| 2013/0307096 A1* | 11/2013 | Classen | B81B 7/00 |
| | | | 257/418 |

* cited by examiner

MOVEMENT MICROELECTROMECHANICAL SYSTEMS (MEMS) PACKAGE

BACKGROUND

Microelectromechanical systems (MEMS) devices, such as accelerometers, pressure sensors, and microphones, have found widespread use in many modern day electronic devices. For example, MEMS accelerometers are commonly found in automobiles (e.g., in airbag deployment systems), tablet computers, or in smart phones.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "First", "second", "third", etc. are not intended to be descriptive of the corresponding element. Therefore, "a first element", such as a first dielectric layer for example, described in connection with a first figure may not necessarily corresponding to a "first element", such as a first dielectric layer for example, described in connection with another figure.

Due to their moveable or flexible parts, MEMS devices have several production challenges that are not encountered with CMOS circuits. One significant challenge with MEMS devices is surface stiction. Surface stiction refers to the tendency of a movable or flexible MEMS part to come into contact with a neighboring surface and "stick" to the neighboring surface. This "stiction" can occur at the end of manufacturing, such that the moveable or flexible part is not quite released from the neighboring surface, or can occur during normal operation when the component suddenly becomes "stuck" to the neighboring surface. Surface stiction can occur in a wide variety of MEMs devices, including actuators, valves, switches, microphones, pressure sensors, accelerators, and/or gyroscopes or any other MEMS device employing moveable or flexible parts.

As feature sizes shrink for successive generations of technology, surface stiction is becoming an increasingly important consideration in MEMS devices. Surface stiction can arise due to any one of several different effects, such as capillary force, molecular van der Waals force, or electrostatic forces between neighboring surfaces. The extent to which these effects cause stiction can vary based on many different factors such as temperature of the surfaces, contact area between the surfaces, contact potential difference between the surfaces, whether the surfaces are hydrophilic or hydrophobic, and so on. Many approaches have been used to attempt to limit surface stiction, however, the previous approaches each have various shortcomings, such as being somewhat costly to implement for example due to required photomasks, or being difficult to integrate with various manufacturing processes.

Therefore, the present application is directed to a MEMS package with improved stiction characteristics, and associated methods of forming such a MEMS package. The MEMS package comprises a MEMS device with a movable or flexible part. A surface of the movable or flexible part of the MEMS device is coated with an anti-stiction layer made of polycrystalline silicon, which has a relatively rough surface texture made up of a series of peaks and valleys. These peaks and valleys, which limit the overall contact area to points where the peaks of the polycrystalline silicon meet the relatively smooth neighboring surface, help limit stiction concerns. Therefore, stiction can be avoided at the end of the manufacturing process and/or during normal operation of the MEMS device; and reliability of the MEMS device is accordingly improved. The concept will be illustrated herein with regards to some example MEMs devices, but it will be appreciated that the concept is applicable to any MEMs device employing moveable parts, including actuators, valves, switches, microphones, pressure sensors, accelerators, and/or gyroscopes, for example.

Figure 1A:
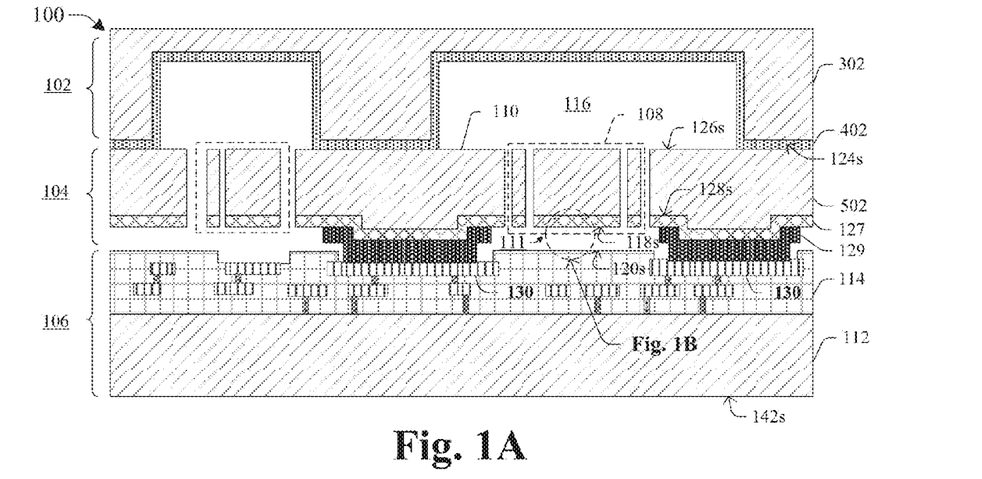
FIG. 1A illustrates a cross-sectional view of some embodiments of a microelectromechanical systems (MEMS) package.

FIG. 1A shows a cross-sectional view of a MEMS package 100 according to some embodiments. The MEMS package 100 comprises a CMOS substrate 106 and a device substrate 104 that are bonded together. The device substrate 104 comprises a MEMS device having a fixed portion 110 and a moveable part 108. In this example, the moveable part corresponds to a proof mass 108. In some embodiments, the proof mass 108 is connected to the fixed portion 110 by one or more cantilever beams or springs (not shown) and at least a portion of the proof mass 108 can move in at least one direction with respect to the fixed portion 110. While a majority portion of the device substrate 104 can be made of bulk semiconductor material 502, such as monocrystalline silicon material, a bottom surface 128s of the device substrate 104 is coated by an anti-stiction layer 127 made of polycrystalline silicon.

Figure 1B:
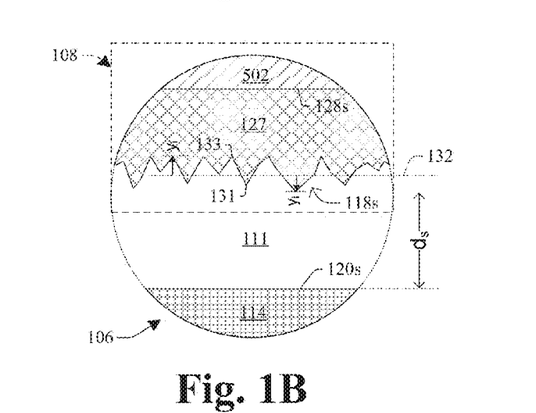
FIG. 1B illustrates a perspective view of some embodiments of an enlarged portion of the MEMS package of FIG. 1A.

As shown in more detail in FIG. 1B, the anti-stiction layer 127 is made of polycrystalline silicon and is disposed at the bottom surface 128s of a bulk semiconductor (e.g., monocrystalline silicon) substrate 502. The small scale lattice structure of polycrystalline silicon introduces a rough surface 118s, which has a series of peaks (e.g., 131) and valleys (e.g., 133), that reduces contact area between the proof mass 108 and the CMOS substrate 106. Thus, stiction force between the proof mass 108 and the CMOS substrate 106 is decreased and the possibility of stiction between lower surface of the proof mass 108 and an upper surface 120s of the CMOS substrate 106 is reduced. In some embodiments, the rough surface 118s of anti-stiction layer 127 has a root mean square (RMS) surface roughness in a range of from about 10 nm to about 30 nm. The RMS surface roughness is calculated as the root mean square of a surface's measured microscopic peaks and valleys, as provided by the formula below:

$$R_q = \sqrt{\frac{1}{n}\sum_{i=1}^{n} y_i^2};$$

wherein $R_q$ is the RMS surface roughness of the anti-stiction layer 127, $y_i$ is the vertical distance from the mean surface 132 to each of n data points, which can be spaced at regular intervals on the mean surface 132. The mean surface 132 is calculated from the roughness profile. In some embodiments, a distance ($d_s$, FIG. 1B) between two neighboring surfaces 118s and 120s of the anti-stiction layer 127 and the underlying CMOS substrate 106 is less than 100 µm, such that stiction could be a consideration that may affect yield and performance of the MEMS package. In some embodiments, the anti-stiction layer 127 is a conformal liner disposed along the bottom surface 128s having a thickness in a range of from about 5 kÅ to about 50 kÅ. The anti-stiction layer 127 can be deposited by chemical vapor deposition process such as low pressure chemical vapor deposition (LPCVD), Plasma-enhanced chemical vapor deposition (PECVD) or atmospheric pressure chemical vapor deposition (APCVD) growth process.

In the embodiment of FIG. 1A, the CMOS substrate 106 comprises an IC device substrate 112 having active elements (e.g., a transistor) and an interconnect layer 114 having metallization layers and via interconnects disposed within an inter-metal dielectric (IMD) material. The CMOS substrate 106 may have a planar upper surface 120s and a lower surface 142s. In some embodiments, the planar upper surface 120s is a top surface of the IMD material while in other embodiments, an additional dielectric layer is disposed over the IMD material of the interconnect layer 114. In some embodiments, a first metal layer 130 may be disposed below a plane of the upper surface 120s. The first metal layer can have a ring-like surface as viewed from above, and a second metal layer 129 can be eutectically bonded to the first metal layer 130 to adhere the device substrate 104 to the CMOS substrate 106. Because the first and second metal layers 129, 130 can have a ring-like configuration, the first and second metal layers 130, 129 can laterally surround a cavity 111, which is bounded above by the proof mass 108 and bounded below by the CMOS substrate 106. As an example, the first metal layer 130 is disposed aligned within an uppermost metallization plane in the CMOS substrate 106 and comprises aluminum, and the second metal layer 129 is made of germanium, and these layers 129, 130 hermetically seal the cavity 111 from the ambient environment. For ease of manufacture, the anti-stiction layer 127 often extends continuously over a lowermost surface 128s of the bulk substrate 502. Thus, in the illustrated embodiment, the anti-stiction layer 127 extends between the second metal layer 129 and the bulk semiconductor substrate 502.

In some embodiments, the MEMS package 100 further comprises a cap substrate 102 bonded to an upper surface 126s of the device substrate 104. The cap substrate 102 and device substrate 104 collectively enclose a cavity 116 over the proof mass 108. In some embodiments, the cavity 116 is in fluid communication with cavity 111 and is hermetically sealed from the ambient environment surrounding the MEMS package 100. However, in other embodiments cavities 111 and 116 are isolated from one another by the proof mass 108, a flexible MEMs membrane, and/or another MEMS structure; and can have the same or different pressures. In some embodiments, a dielectric layer 402, for example, a silicon dioxide layer, is disposed over a front surface 124s of the cap substrate at a location of a fusion bond interface. The dielectric layer 402 can be a conformal liner disposed along the front surface 124s and the cavity 116, and promotes fusion bonding of the cap substrate 102 to the device substrate 104. In some embodiments, the CMOS substrate 106, the device substrate 104 or the cap substrate 102 may comprise bulk semiconductor substrates including one or more of, for example, silicon, germanium, silicon carbide, a group III element, and a group V element. In other embodiments, one or more of the CMOS substrate 106, the device substrate 104 or the cap substrate 102 are semiconductor-on-insulator (SOI) substrates, such as silicon-on-insulator or polysilicon-on-insulator (POI) substrates, for example.

During operation of the MEMS package 100 of FIG. 1A, the proof mass 108 can move with respect to the CMOS substrate 106 commensurate with a force experienced by the MEMS package 100. For example, if the MEMS package 100 is moved upward suddenly in FIG. 1A, the proof mass 108 will tend to stay at rest such that the proof mass 108 and CMOS substrate 106 will squeeze closer together during the acceleration. This temporary change in spacing due to the acceleration correspondingly provides a temporary change in a capacitance between the proof mass 108 and CMOS substrate 106. The capacitance between the CMOS substrate 106 and proof mass 108 can be monitored, and the acceleration experienced by the MEMS device can then be calculated based on this monitored capacitance.

Figure 1C:
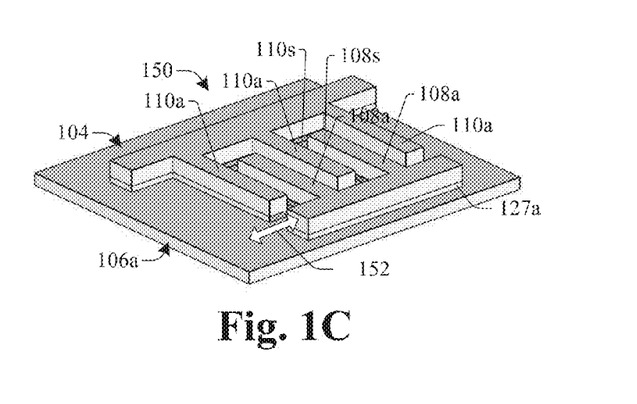
FIG. 1C illustrates a perspective view of some embodiments of a MEMS device of the MEMS package of FIG. 1A.

FIG. 1C shows a perspective view of another MEMS device 150 according to some embodiments. The MEMS device 150 can be an accelerometer having a first plurality of fingers 110a with a second plurality of fingers 108a inter-digitated there between. The first plurality of fingers 110a is fixed to a device substrate 104, and is configured as a fixed electrode of a capacitor. The second plurality of fingers 108a is connected to the device substrate 104 through one or more cantilever beams or springs (not shown) and is movable laterally (see arrow 152) relative to the first plurality of fingers 110a, configured as the other movable electrode of the capacitor. The anti-stiction layer 127a made of polycrystalline silicon is disposed at a bottom surface of the device substrate 104, having a rough exposed surface to prevent or limit the second plurality of fingers 108a from sticking to an upper surface of an underlying substrate 106a. Compared to the embodiment of FIG. 1A where the proof mass 108 was described as moving upward and downward to measure an acceleration experienced by the device 100; the proof mass 108a of the accelerometer of FIG. 1C can move laterally (see arrow 152) such that the distance between neighboring proof mass and fixed portion sidewalls 108s, 110s changes in response to acceleration. Therefore, whereas the anti-stiction surface 127 of FIG. 1A was described with regards to an example where stiction was limited in a direction of movement perpendicular to the anti-stiction surface 127; FIG. 1C illustrates an example where the anti-stiction surface 127a limits stiction for a direction of movement that is generally parallel to the anti-stiction surface 127a.

Therefore, as can be seen from the above embodiments, a polycrystalline silicon anti-stiction layer can be advantageous in reducing stiction in MEMS structures. The precise surface roughness that is present for the polycrystalline silicon anti-stiction layer can vary depending on the growth process used, but typically exhibit a rough surface of peaks and valleys. These peaks and valleys are often irregular, with the depths and widths of the valleys varying over a length or area of the surface, and/or the height and widths of the peaks also varying over a length or area of the surface. In other embodiments, however, it may be possible to have peaks and/or valleys that have regular depths and/or widths. Aside from advantageously limiting stiction, polycrystalline silicon is relatively simple to incorporate into modern semiconductor manufacturing process, and can be synthesized in-situ easily and affordably for most processes. Also, polycrystalline silicon is compatible with other MEMS materials (e.g. bulk silicon), so it is possible to limit the amount of patterning used after formation of the anti-stiction layer. Thus, the use of a polycrystalline anti-stiction layer is beneficial in many regards.

Figure 2:
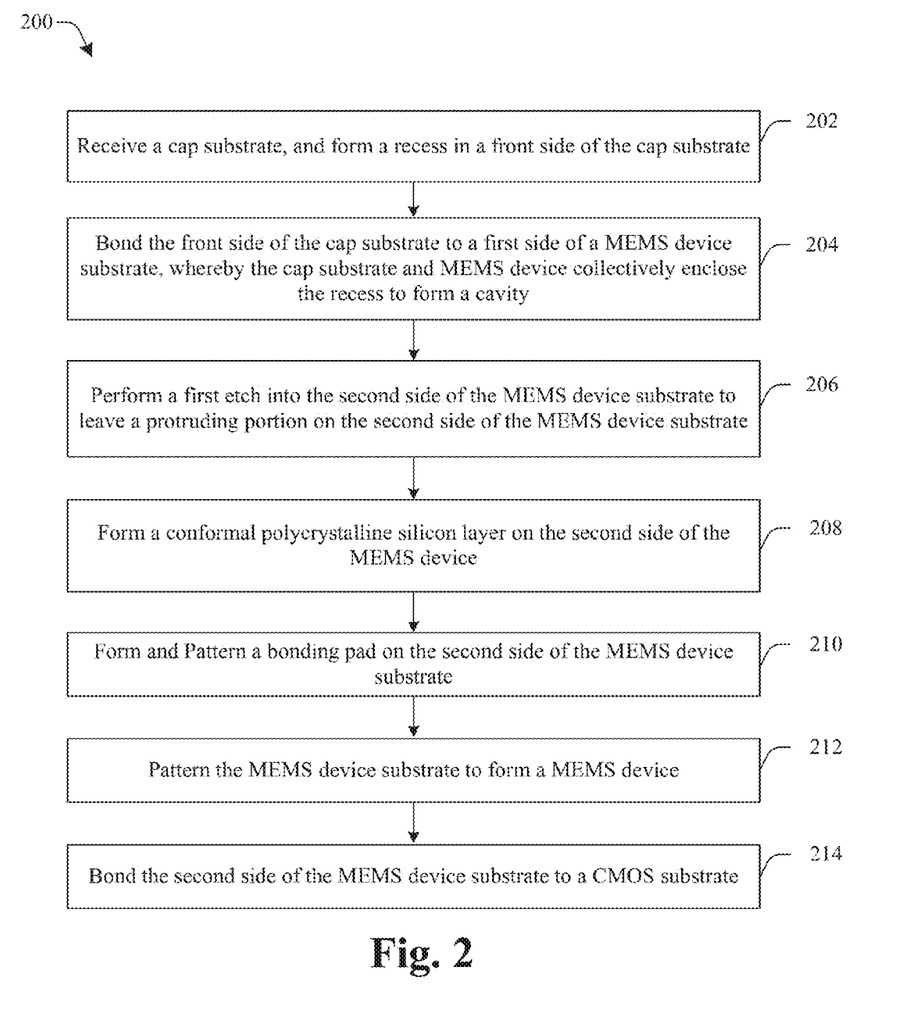
FIG. 2 illustrates a flow chart of some embodiments of a method for manufacturing a MEMS package.

With reference to FIG. 2, a flowchart provides some embodiments of a method for manufacturing a MEMS package including a movable or flexible MEMS device coated by an anti-stiction layer. The anti-stiction layer comprises polycrystalline silicon with a rough surface, such as previously illustrated and described with regards to the MEMS packages shown in FIGS. 1A and 1C, for example.

While disclosed methods (e.g., method 200) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 202, a cap substrate is provided. A recess is formed in a front side of the cap substrate, such that inner sidewalls extend from a recessed surface of the cap substrate to a frontmost surface of the cap substrate.

At act 204, the front side of the cap substrate is bonded to a first side of a MEMS device substrate. The MEMS device substrate meets the cap substrate so they collectively enclose the recess and thereby define a cavity between the MEMS device substrate and the cap substrate.

At act 206, a first etch is performed into the second side of the MEMS device substrate to form a protruding portion on the second side of the MEMS device substrate.

At act 208, a conformal polycrystalline silicon layer is formed on the second side of the MEMS device substrate.

At act 210, a bonding pad is formed at the second side of the MEMS device substrate. In some embodiments, the bonding pad partially covers the polycrystalline silicon layer.

At act 212, the MEMS device substrate is patterned to form a MEMS device. For example, a release etch can be used to free a moveable part on the MEMS device from a surrounding region of the MEMS device substrate.

At act 214, the second side of the MEMS device substrate is bonded to a CMOS substrate.

FIGS. 3-11 show a series of cross-sectional views that collectively depict formation of a MEMS package according to some embodiments. Although FIGS. 3-11 are described in relation to the method 200, it will be appreciated that the structures disclosed in FIGS. 3-11 are not limited to the method 200, but instead may stand alone as structures independent of the method 200. Similarly, although the method 200 is described in relation to FIGS. 3-11, it will be appreciated that the method 200 is not limited to the structures disclosed in FIGS. 3-11, but instead may stand alone independent of the structures disclosed in FIGS. 3-11.

Figure 3:
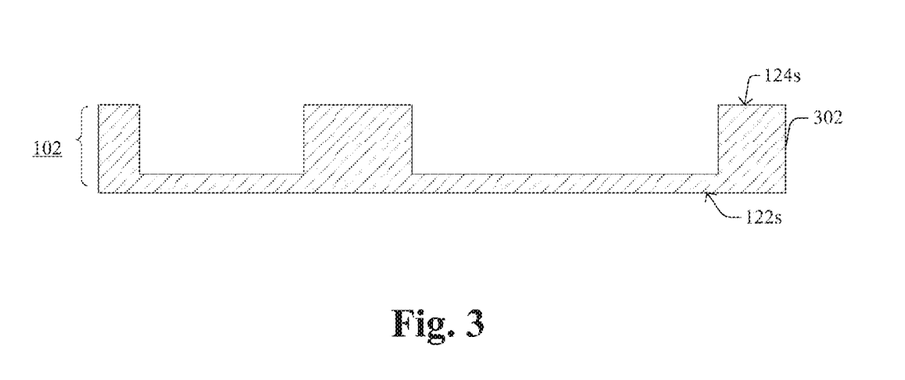
FIGS. 3-10 illustrate a series of cross-sectional views of some embodiments of a MEMS package at various stages of manufacture.

FIG. 3 shows a cross-sectional view corresponding to act 202 according to some embodiments. As shown in FIG. 3, a cap substrate 102 with a front surface 124s and a back surface 122s is provided. The cap substrate 102 can be prepared from a bulk semiconductor wafer 302 including, for example, a monocrystalline or single crystalline silicon wafer, or another substrate made of germanium, silicon carbide, a group III element, and/or a group V element, for example. In some embodiments, a recess can be formed at a front side of the cap substrate 102 from the front surface 124s. The recess can be etched to a proper depth at a location corresponding to movable or flexible portion of the MEMS device. Though not shown in FIG. 3, the cap substrate may be prepared with other patterning processes. For example, a TSV opening can be formed at this step to prepare for a contact at a back side of the cap substrate 102 to electrically couple the MEMS device.

Figure 4:
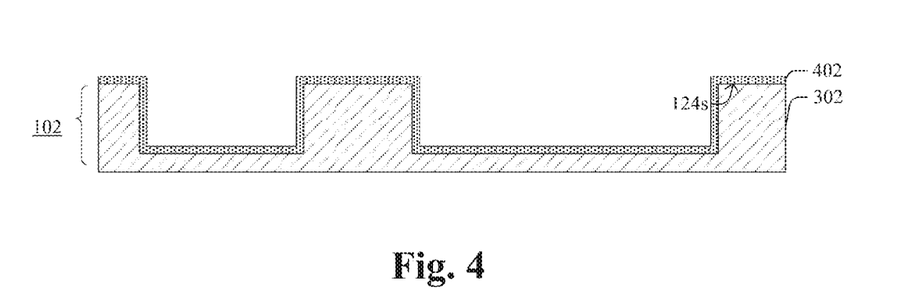

As shown in FIG. 4, the cap substrate 102 is then prepared for a bonding process. In some embodiments, a fusion bond layer 402 can be formed over the front surface 124s of the cap substrate 102. The fusion bond layer 402 can extend continuously along the front surface 124s and over exposed surfaces of the recess. In some alternative embodiments, the fusion bond layer 402 is formed before patterning of the recess, thus, the fusion bond layer 402 would only cover remaining portion of the front surface 124s and not formed on the surfaces of the recess. In some other embodiments, a metal pad or metal ring act can be formed on the front surface 124s of the cap substrate 102 and can act as a eutectic bonding pad.

Figure 5:
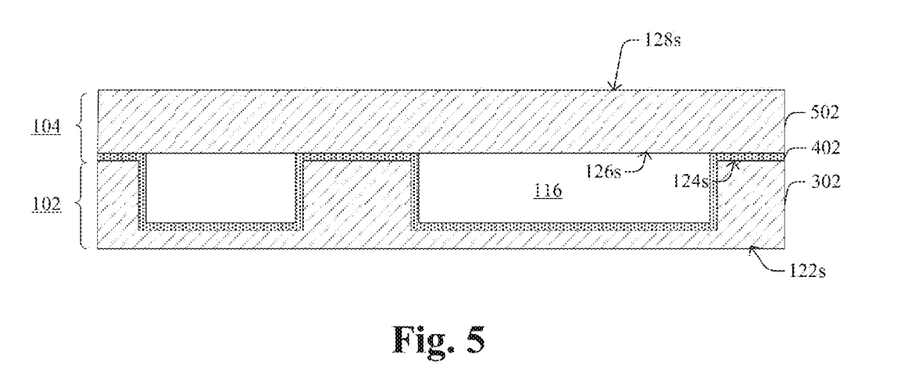

FIG. 5 shows a cross-sectional view corresponding to act 204 according to some embodiments. As shown in FIG. 5, a MEMS device substrate 104 has a first side having an upper surface 126s and a second side having a bottom surface 128s. The front side of the cap substrate 102 is bonded to the first side of a MEMS device substrate 104 such that the MEMS device substrate 104 and cap substrate 102 collectively enclosing the recess to form a cavity 116. In some embodiments, the MEMS device substrate 104 can be prepared from a bulk semiconductor wafer 502 including, for example, one or more of silicon, germanium, silicon carbide, a group III element, and a group V element. In some embodiments, fusion bonding is used to bond the MEMS device substrate 104, which can comprise Silicon for example, to the fusion bond layer 402, which can comprise SiO$_2$. In some embodiments, the MEMS device substrate 104 and/or the cap substrate 102 is thinned down to reduce the thickness thereof after fusion bonding.

Figure 6:
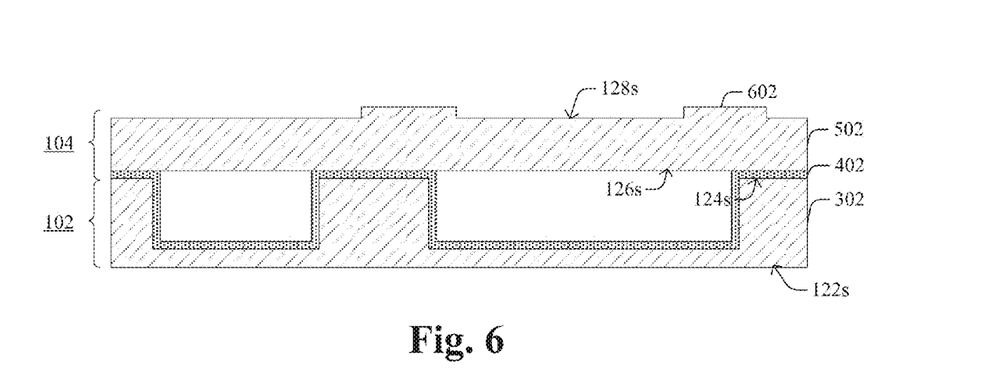

FIG. 6 shows a cross-sectional view corresponding to act 206 according to some embodiments. As shown in FIG. 6, a first etch is performed on the second side of the MEMS device substrate 104 to form a protruding portion 602 on the second side of the MEMS device substrate 104. Notably, among other considerations, an applicable height of the protruding portion 602 is formed with a consideration of providing sufficient space for motion and/or suitable stiction force between a movable or flexible part of the MEMS device to be formed and a neighboring component.

Figure 7:
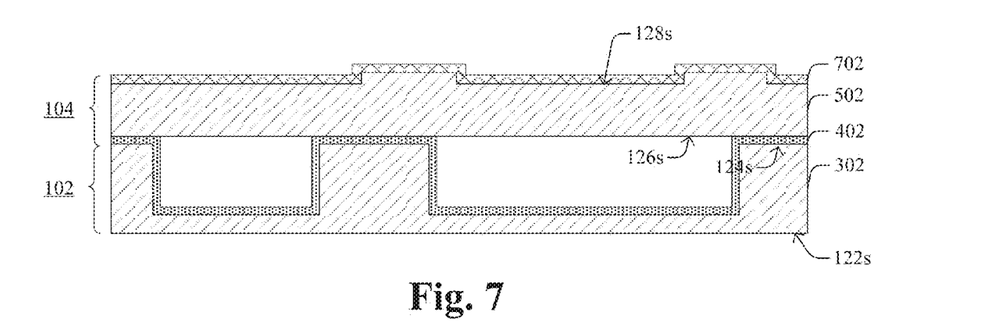

FIG. 7 shows a cross-sectional view corresponding to act 208 according to some embodiments. As shown in FIG. 7, a polycrystalline silicon layer 702 is formed at the second side of the MEMS device substrate along the bottom surface 128s. In some embodiments, the polycrystalline silicon layer 702 is formed by a chemical vapor deposition process, such as low pressure chemical vapor deposition (LPCVD), plasma-enhanced chemical vapor deposition (PECVD) or an atmospheric pressure chemical vapor deposition (APCVD) growth process. As a non-limiting example, the polycrystalline silicon layer 702 can be formed in a LPCVD system by silane as a reactant at a pressure smaller than 1 torr and a temperature around 600° C. In some embodiments, the anti-stiction layer 127 can be formed with a RMS surface roughness in a range of from about 10 nm to about 30 nm (the RMS surface roughness is calculated as the Root Mean Square of a surfaces measured microscopic peaks and valleys). In some embodiments, the anti-stiction layer 127 is formed as a conformal liner disposed along the bottom surface 128s having a thickness in a range of from about 5 kÅ to about 50 kÅ. In some embodiments, the polycrystalline silicon layer 702 can be formed with applicable doping by adding phosphine, arsine, or diborane to the reactants.

Figure 8:
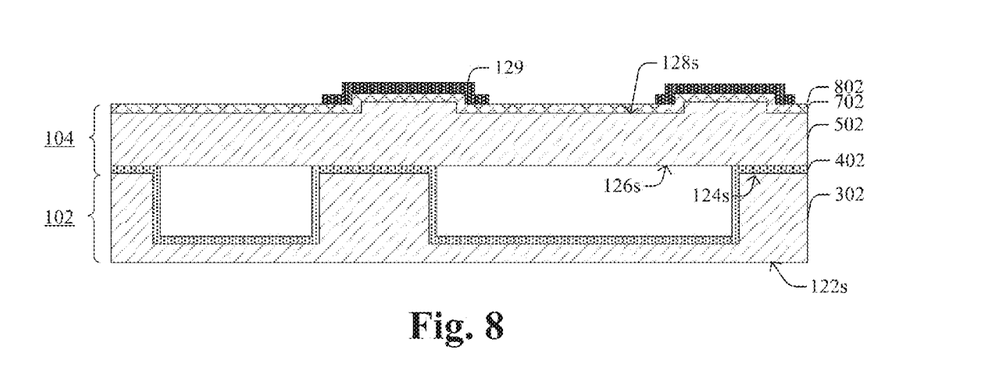

FIG. 8 shows a cross-sectional view corresponding to act 210 according to some embodiments. As shown in FIG. 8, the MEMS device substrate 104 is prepared for a succeeding bonding process. In some embodiments, a metal layer 129 configured as a bonding pad is formed over the polycrystalline silicon layer 702. The metal layer 129 can comprise metals such as aluminum (Al), germanium (Ge), gold (Au), copper (Cu), Tin (Sn) or alloys. The metal layer 129 can be formed by firstly depositing a bonding material (e.g. Ge) covering the polycrystalline silicon layer 702 followed by patterning the bonding material to form some separate bonding pads in rectangular shape for example or a bonding ring at a bonding position at peripheral of the MEMS device.

Figure 9:
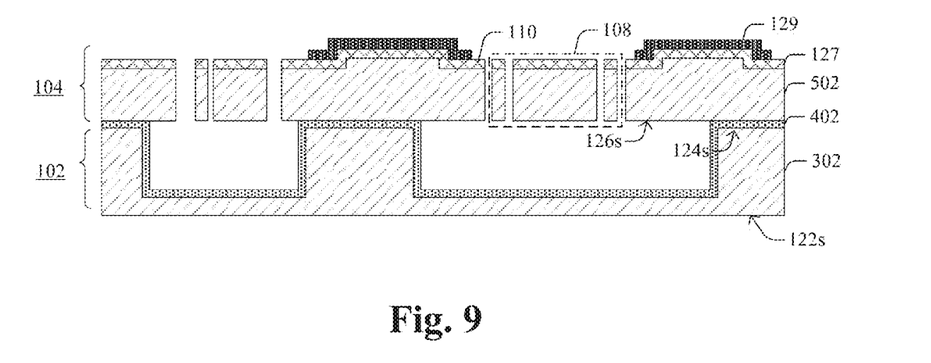

FIG. 9 shows a cross-sectional view corresponding to act 212 according to some embodiments. As shown in FIG. 9, the MEMS device substrate 104 is patterned to form the MEMS device. The MEMS device is or otherwise includes, for example, micro-actuators or micro-sensors such as a micro-valve, a micro-switch, a microphone, a pressure sensor, an accelerator, a gyroscope or any other device having a movable or flexible part that moves or flexes with respect to the fixed portion 110.

Figure 10:
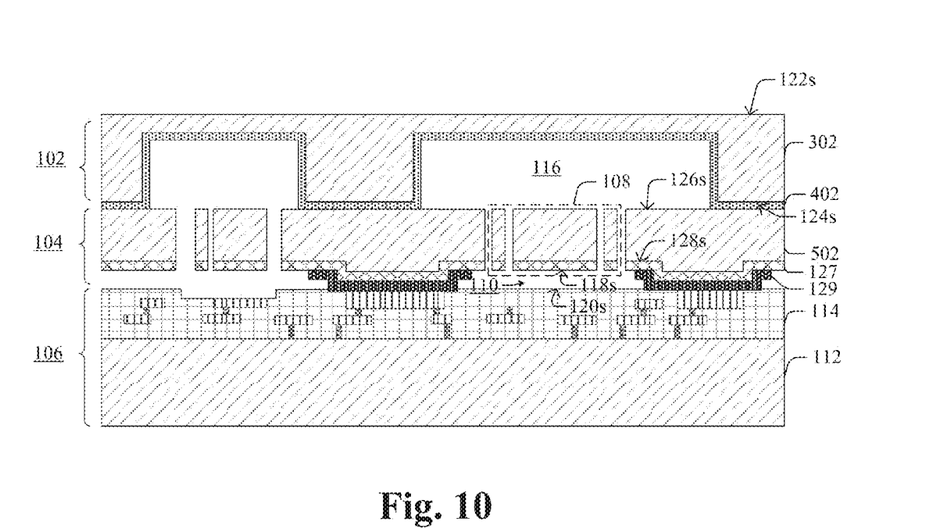

FIG. 10 shows a cross-sectional view corresponding to act 214 according to some embodiments. As shown in FIG. 10, the MEMS device substrate 104 is bonded to a CMOS substrate 106. An upper surface 120s of the CMOS substrate 106 faces the polycrystalline silicon layer 702. In some embodiments, the CMOS substrate 106 has been prepared through one or more fabrication processes prior to the bonding. For example, the CMOS substrate 106 includes one or more active elements. A series of metallization planes and via interconnects are disposed within an IMD layer formed over an upper surface of the IC device substrate 112. In some embodiments, the MEMS device substrate 104 is bonded to the CMOS substrate 106 by a semiconductor-to-metal bonding between a semiconductor material and a metal material. In some embodiments, the semiconductor material includes at least one of Ge, Si, SiGe or another semiconductor material. In some embodiments, the metal material includes at least one of Al, Cu, Ti, Ta, Au, Ni, Sn, or another metal. In some other embodiments, the MEMS device substrate 104 is bonded to the CMOS substrate 106 by eutectic bonding between two metal materials each including at least one of Al, Cu, Ti, Ta, Au, Ni, Sn, or another metal. The materials to be bonded are pressed against each other in an annealing process to form a eutectic phase of the materials. For example, a eutectic bonding between Ge and Al is formed at an annealing temperature in a range from 400° C. to 450° C.

After the MEMS device substrate 104 is bonded to the CMOS substrate 106, the MEMS package is formed when the bonded substrates 104, 106, which are often bonded at the wafer level, are diced into separate chips after bonding. Thus, as can be appreciated from above, the present disclosure relates to a MEMS package and associated methods. The MEMS package comprises a movable or flexible MEMS device such as micro-actuators or micro-sensors. An anti-stiction layer, made of polycrystalline silicon with rough surface is disposed at a surface of the MEMS device. The anti-stiction layer is configured to reduce stiction force between a movable or flexible portion of the MEMS device and another surface.

In some embodiments, the present disclosure provides a MEMS package. The MEMS package comprises a device substrate comprising a MEMS device having a moveable or flexible part that is movable or flexible with respect to the device substrate. The MEMS package further comprises a CMOS substrate bonded to the device substrate. A surface of the moveable or flexible part is coated by a conformal anti-stiction layer made of polycrystalline silicon.

In other embodiments, the present disclosure provides a MEMS package. The MEMS package comprises a CMOS substrate having an upper surface and a lower surface. The MEMS package further comprises a monocrystalline silicon device substrate bonded to the CMOS substrate and comprising a movable or flexible MEMS device coated by a conformal anti-stiction layer proximate to the upper CMOS substrate surface. The anti-stiction layer is made of polycrystalline silicon having a RMS surface roughness in a range of from about 10 nm to about 30 nm. The MEMS package further comprises a cap substrate bonded to an upper surface of the device substrate, enclosing a sealant cavity over the movable or flexible MEMS device.

In yet other embodiments, the present disclosure provides a method for manufacturing a MEMS package. The method comprises forming a cap substrate having a recess at a front side of the cap substrate. The method further comprises bonding the cap substrate to a MEMS device substrate made of monocrystalline silicon to enclose the recess and thereby form a cavity. The method further comprises depositing a conformal polycrystalline silicon layer to cover an exposed surface of the MEMS device substrate. The method further comprises patterning the MEMS device substrate and the conformal polycrystalline silicon layer to form a movable or flexible MEMS device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical systems (MEMS) package comprising:
   a device substrate comprising a MEMS device having a moveable or flexible part that is movable or flexible with respect to the device substrate; and
   a CMOS substrate bonded to the device substrate by a first bonding pad attached to the device substrate and a second bonding pad attached to the CMOS substrate, the first bonding pad and the second bonding pad meeting at a bonding interface;
   wherein a surface of the moveable or flexible part is coated by a conformal anti-stiction layer made of polycrystalline silicon;
   wherein the conformal anti-stiction layer is disposed between the device substrate and the first bonding pad.

2. The MEMS package of claim 1, wherein the moveable or flexible part is made of monocrystalline silicon.

3. The MEMS package of claim 1, wherein the conformal anti-stiction layer has a thickness in a range of from about 5 kÅ to about 50 kÅ and a root mean square (RMS) surface roughness in a range of from about 10 nm to about 30 nm.

4. The MEMS package of claim 1, wherein the CMOS substrate is bonded to the device substrate by an Al—Ge eutectic bonding pad, and wherein the conformal anti-stiction layer is disposed between the device substrate and the Al—Ge eutectic bonding pad.

5. The MEMS package of claim 1, further comprising a cap substrate having a lower surface that abuts an upper surface of the device substrate such that the cap substrate and device substrate collectively form a cavity over the moveable or flexible part.

6. The MEMS package of claim 5, wherein a fusion bond bonds the cap substrate to the device substrate.

7. The MEMS package of claim 1, wherein the conformal anti-stiction layer covers bottom surfaces of the device substrate that is proximate the CMOS substrate.

8. The MEMS package of claim 1, wherein the first bonding pad is disposed on a protruding portion of the device substrate; and wherein the second bonding pad is disposed on a recess portion of the CMOS substrate.

9. The MEMS package of claim 1, wherein the MEMS device comprises an accelerometer having a plurality of fixed fingers separated by a plurality of movable fingers, wherein bottom surfaces of the movable fingers are covered by the conformal anti-stiction layer to limit stiction to an underneath upper surface of the CMOS substrate.

10. A microelectromechanical systems (MEMS) package comprising:
    a CMOS substrate having an upper surface and a lower surface;
    a monocrystalline silicon device substrate bonded to the upper surface of the CMOS substrate and comprising a movable or flexible MEMS device; and
    a conformal anti-stiction layer lining a lower lateral surface of the movable or flexible MEMS device proximate to the upper surface of the CMOS substrate, but not lining inner sidewalls or an upper lateral surface of the movable or flexible MEMS device opposite to the lower lateral surface.

11. The MEMS package of claim 10, further comprising:
    a cap substrate bonded to an upper surface of the device substrate such that the cap substrate and device substrate collectively form a sealed cavity over the movable or flexible MEMS device.

12. The MEMS package of claim 10, wherein the conformal anti-stiction layer has a thickness in a range of from about 5 kÅ to about 50 kÅ.

13. The MEMS package of claim 10, wherein the conformal anti-stiction layer is coated on a bottom surface of the device substrate that is proximate an upper surface of the CMOS substrate.

14. The MEMS package of claim 10, wherein the movable or flexible MEMS device is electrically coupled to an IC device disposed on the CMOS substrate through a eutectic bonding pad.

15. The MEMS package of claim 14, wherein a portion of the conformal anti-stiction layer is disposed between a germanium bonding pad and the device substrate.

16. The MEMS package of claim 14, wherein the device substrate has a protruding portion at a position of the eutectic bonding pair and the conformal anti-stiction layer is disposed continuously along surfaces of the protruding portion.

17. A method for manufacturing a microelectromechanical systems (MEMS) device, the method comprising:
    forming a cap substrate having a recess in a front side of the cap substrate;
    bonding the cap substrate to a MEMS device substrate made of monocrystalline silicon such that the cap substrate and MEMS device substrate collectively enclose the recess and thereby form a cavity;
    depositing a conformal polycrystalline silicon layer to cover an exposed surface of the MEMS device substrate opposite to the cap substrate; and
    after the conformal polycrystalline silicon layer is deposited, patterning the MEMS device substrate and the conformal polycrystalline silicon layer to form a movable or flexible MEMS device, such that the conformal polycrystalline silicon layer is not disposed on sidewalls or a lateral surface of the MEMS device substrate proximate to the cap substrate.

18. The method according to claim 17, further comprising:
    forming and patterning a germanium bonding pad at the MEMS device substrate; and
    bonding a CMOS substrate to the MEMS device substrate at the germanium bonding pad;
    wherein the movable or flexible MEMS device is electrically coupled to an IC device disposed on the CMOS substrate.

19. The method according to claim 18, further comprising:
    performing an etch on the MEMS device substrate prior to depositing the conformal polycrystalline silicon layer to form a protruding portion.

20. The method according to claim 17, further comprising:
    forming a conformal fusion bond layer along exposed front surfaces of the cap substrate prior to bonding the cap substrate to the MEMS device substrate.

* * * * *